United States Patent [19]
Liu et al.

[11] Patent Number: 5,877,049
[45] Date of Patent: Mar. 2, 1999

[54] METHOD FOR FORMING ADVANCED TRANSISTOR STRUCTURES WITH OPTIMUM SHORT CHANNEL CONTROLS FOR HIGH DENSITY/HIGH PERFORMANCE INTEGRATED CIRCUITS

[75] Inventors: Yowjuang W. Liu, San Jose; Kuang-Yeh Chang, Los Gatos, both of Calif.

[73] Assignee: Advanced Micro Devices, Inc., Sunnyvale, Calif.

[21] Appl. No.: 717,981

[22] Filed: Sep. 23, 1996

Related U.S. Application Data

[62] Division of Ser. No. 408,613, Mar. 22, 1995, Pat. No. 5,608,253.

[51] Int. Cl.$^6$ .............................................. H01L 21/8238
[52] U.S. Cl. ........................... 438/224; 438/217; 438/370
[58] Field of Search .............................. 437/44; 438/199, 438/370, 217, 223, 224, 175; 257/69

[56] References Cited

U.S. PATENT DOCUMENTS

| | | |
|---|---|---|
| 4,864,377 | 9/1989 | Widdershoven . |
| 5,191,401 | 3/1993 | Shirai et al. . |
| 5,247,200 | 9/1993 | Momose et al. . |
| 5,489,540 | 2/1996 | Liu et al. ................................. 437/30 |
| 5,608,253 | 3/1997 | Liu et al. ................................ 257/365 |

*Primary Examiner*—John F. Niebling
*Assistant Examiner*—John Murphy
*Attorney, Agent, or Firm*—Townsend and Townsend and Crew LLP

[57] ABSTRACT

A novel MOS transistor structure for improving device scaling by improving short channel control includes a buried back gate beneath a channel region of the MOS transistor. A separate contact to a well that is electrically communicated to the buried back gate improves short channel controls without performance degradations. In a preferred embodiment, the back gate is grounded when turning the n-channel MOS transistor off. In alternate embodiments, the buried layer produces retrograde p wells. In some applications, multiple buried layers may be used, with one or more being planar. CMOS devices may have independent, multiple buried back gates.

13 Claims, 4 Drawing Sheets

METHOD FOR FORMING ADVANCED TRANSISTOR STRUCTURES WITH OPTIMUM SHORT CHANNEL CONTROLS FOR HIGH DENSITY/HIGH PERFORMANCE INTEGRATED CIRCUITS

This is a Division of application Ser. No. 08/408,613 filed Mar. 22, 1995, now U.S. Pat. No. 5,608,253.

BACKGROUND OF THE INVENTION

The present invention relates generally to improvements in semiconductor fabrication processes, and more particularly to improvements in processes to improve device scaling.

As well-known in the art, device scaling refers to an amount of semiconductor area required for each active device, such as a transistor, for example. Current semiconductor fabrication processes are limited to the degree to which active devices can be moved closer together. The transistor is a fundamental building block of an integrated circuit.

One popular implementation of the transistor in a semiconductor is formation of a metal-oxide semiconductor (MOS) transistor. This is a common transistor structure, having two active regions, a source and a drain, separated by a channel. A gate controls conductivity of carriers in the channel for conduction or impedance of current between the source and drain.

With current transistor structures, as the channel is shortened and the source and drain are brought closer, the transistor begins to exhibit undesirable characteristics. Some of these undesirable characteristics are instability of a threshold voltage, sub-threshold leakage, current flow when the transistor is to be turned off ($I_{OFF}$) and hot carrier injections/degradations. These undesirable characteristics are well-known and will not be further described herein.

SUMMARY OF THE INVENTION

The present invention provides apparatus and method for simply, efficiently and economically improving short channel gate controls in order to improve device scaling. A novel transistor structure, and method of manufacture, is described that includes a built-in buried conductive layer that underlies the gate in a transistor. The second buried gate is formed by a deep dopant implant that is self-aligned to the transistor's traditional gate and source/drain regions, including any lightly doped drain (LDD) regions.

The novel transistor improves short channel effects by providing a second gate electrode that electrically influences the traditional source/drain interactions when a channel separating the source and drain becomes narrower. In some embodiments, multiple buried layers enhance or complement effects from one buried gate. The buried layer assists in providing an effective shield for either n-channel, or p-channel, by protecting the transistor from hot carrier induced substrate currents. This shield improves device reliabilities. The process is simple to implement, with some embodiments not requiring any additional masks.

According to one aspect of the invention, it includes a substrate, a first and a second active region coupled to the substrate and separated from each other by a channel region. A well region is disposed away from the active regions, and a buried layer underlies the channel region and is electrically coupled to the well region. The buried layer assists control of a conductivity of the channel region.

Reference to the remaining portions of the specification, including the drawing and claims, will realize other features and advantages of the present invention. Further features and advantages of the present invention, as well as the structure and operation of various embodiments of the present invention, are described in detail below with respect to accompanying drawing. In the drawing, like reference numbers indicate identical or functionally similar elements.

DESCRIPTION OF THE PREFERRED EMBODIMENT

Figure 1:
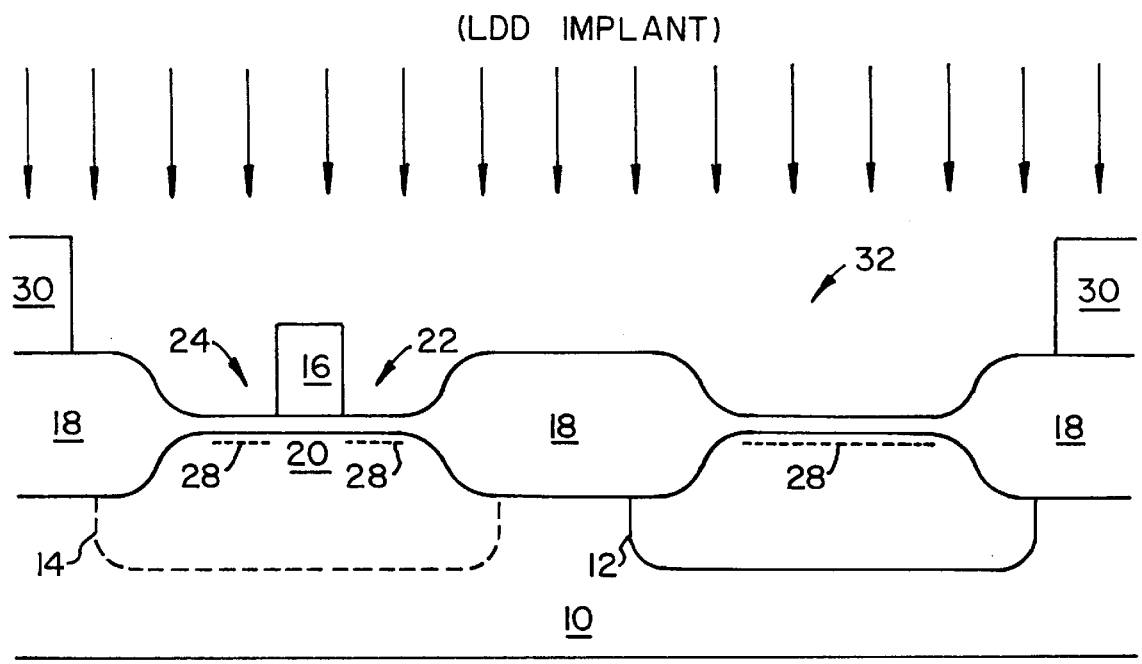
FIG. 1 is a partial, sectional view of a portion of a semiconductor substrate after formation of active regions and gate structures in the active regions receiving a lightly-doped drain (LDD) implant through an LDD mask.

FIG. 1 is a partial, sectional view of a portion of a semiconductor substrate 10 after formation of a first well 12, an optional second well 14, and a gate 16 with a field isolation region 18 electrically isolating well region 12 from well region 14.

In the following discussion, various references will be made to a particular conductivity type for dopants, materials and implants used in the preferred embodiment. These specific identifications of a particular dopant type are made in order to facilitate description of a preferred embodiment. As well understood by persons of ordinary skill in the art, dopant types may be substituted, depending upon a particular application. Thus, the details regarding dopant type should not be construed to be limiting.

Gate 16 overlies a portion 20 of second well 14, separating a first region 22 from a second region 24. In the preferred embodiment, gate 16 is polysilicon or polysililcide. An optional lightly doped drain (LDD) first implant mask 30 overlies substrate 10 and provides a first exposure window 32 through which an LDD implant 28 is introduced into exposed portions of substrate 10. First implant mask 30 is thick enough to protect those regions of substrate 10 it covers from receiving LDD implant 28. Implant mask 30 is preferably formed of a suitable resist, as well known in the art. First exposure window 32 allows LDD implant 28 to be introduced near a surface of first region 22, second region 24, and first well 12. For the preferred embodiment, LDD implant 28 dose is low, on the order of about $1 \times 10^{13}$ atoms/cm$^3$.

Figure 2:
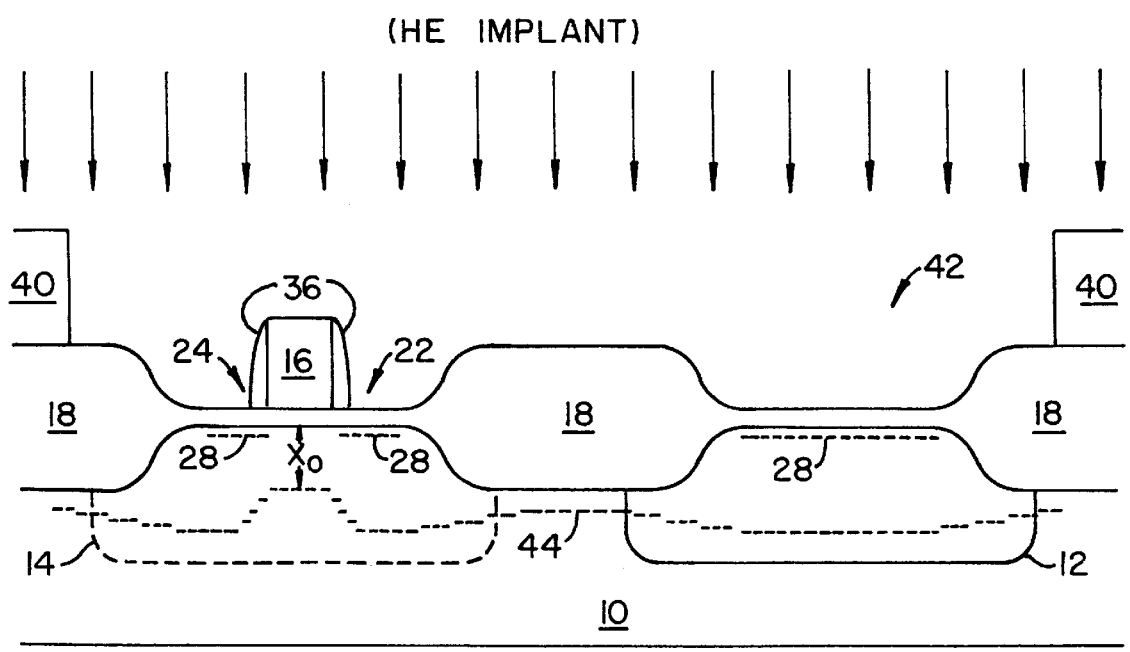
FIG. 2 is a partial, sectional view of the portion of the substrate shown in FIG. 1 receiving a high energy implant using an implant mask.

FIG. 2 is a partial, sectional view of the portion of substrate 10 shown in FIG. 1, after forming a lateral spacer 36 on gate 16. Lateral spacer 36 covers a portion of region 22 and region 24 near gate 16. Lateral spacer 36 protects the LDD implant it covers during subsequent processing and implanting steps.

A second implant mask 40 covers substrate 10 and provides a second exposure window 42 through which two implants are introduced into exposed portions of substrate 10. Second implant mask 40 is a suitable resist, as well known in the art. FIG. 2 illustrates one implant, a high energy implant 44, being introduced deep into substrate 10 through exposure window 42. HE implant 44 is implanted into first well 12 and second well 14. HE implant 44 has a dose and energy sufficient to penetrate through gate 16, field isolation region 18, and lateral spacer 36.

As shown, HE implant 44 has a varying depth contour, being relatively deeper into substrate 10 under LDD implant 28, and relatively shallower into substrate 10 under gate 16 and under field isolation region 18. The varying depth contour results from implanting HE implant 44 after formation of field isolation regions and gate structures. HE implant 44 extends from under portion 20, under field isolation region 18, and into first well 12.

In the preferred embodiment, HE implant 44 has a preferable dose range for atoms of one conductivity type (e.g., arsenic or phosphorous) of about $1 \times 10^{13}$ to about $1 \times 10^{16}$, and more preferably less than $1 \times 10^{15}$ atoms/cm$^3$. HE implant 44 has a preferred energy range of about 750 keV to about 2250 keV for arsenic dopants, and a preferred energy range of about 350 keV to about 1200 keV for phosphorous dopants. HE implant 44 has a depth, $X_p$ under gate 16.

Figure 3:
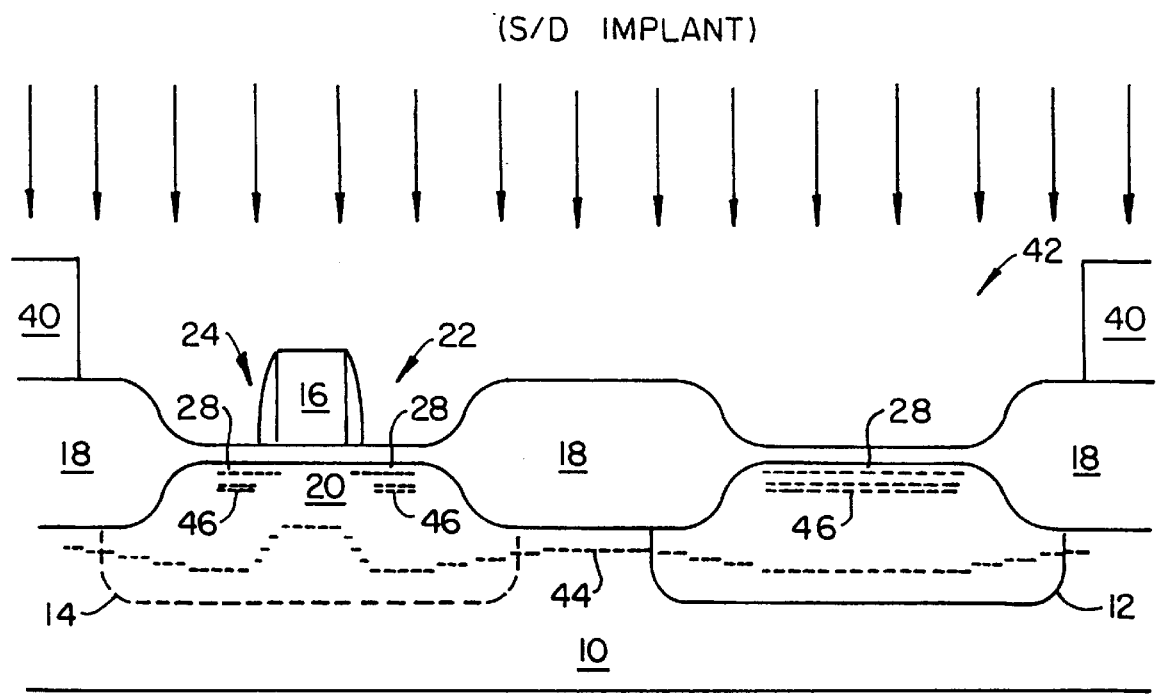
FIG. 3 is a partial, sectional view of the portion of the substrate shown in FIG. 2 receiving a shallow implant.

FIG. 3 is a partial, sectional view of the portion of substrate 10 shown in FIG. 2 that illustrates implanting the second implant (a source/drain implant 46) through second implant mask 40. Source/drain implant 46 is relatively shallow, but deeper than LDD implant 28. In optional second well 14, source/drain implant 46 lies under those portions of LDD implant 28 not covered by spacer 36. In first well 14, source/drain implant 46 lies under LDD implant 28.

Figure 4:
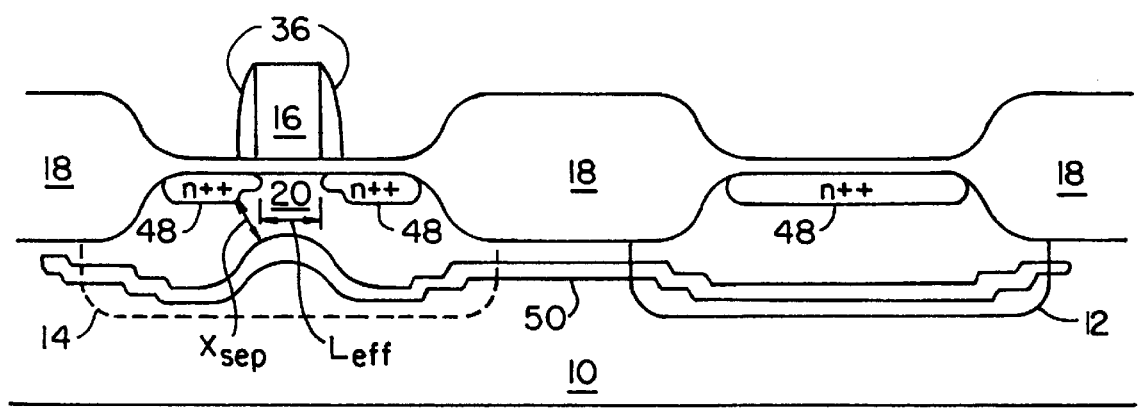
FIG. 4 is a partial, sectional view of the portion of the substrate shown in FIG. 3 after annealing to form the source/drain regions and a back gate.

FIG. 4 is a partial, sectional view of the portion of substrate 10 shown in FIG. 3 after removing second implant mask 40 (shown in FIG. 3) and annealing substrate 10 to form a plurality of active regions 48 and a back gate 50. Annealing forms each active region 48 by merging LDD implant 28 with source/drain implant 46, as well known. Annealing also forms back gate 50 from HE implant 44. Back gate 50 has the same general shape as HE implant 44, shown for example in FIG. 3, and in the preferred embodiment, a variable depth contour. Back gate 50 is relatively close to portion 20, that forms a channel between two active regions 48 in optional second well 14.

As well known in the art, a dimension referred to as an effective length ($L_{eff}$) exists between active regions 48 that form source and drain regions of a metal oxide semiconductor (MOS) transistor. Under gate 16, HE implant 44 has a depth $X_p$ prior to annealing, that is about equal to $L_{eff}$ of active regions 48 on opposite sides of gate 16. A distance $X_{sep}$ identifies a minimum distance between a source/drain region and back gate 50.

Figure 5:
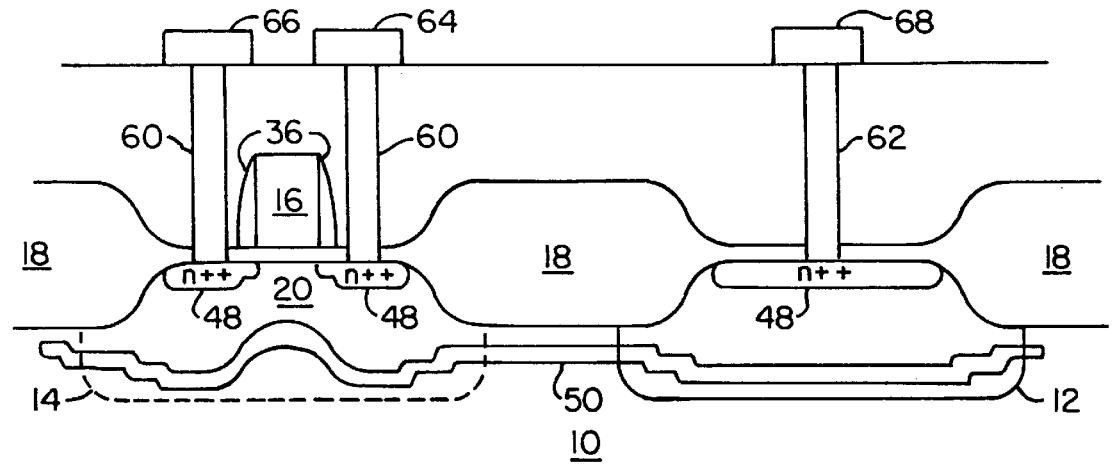
FIG. 5 is a partial, sectional view of the portion of the substrate shown in FIG. 4 after contact formation and metalization.

FIG. 5 is a partial, sectional view of the portion of substrate 10 shown in FIG. 4 after conventional contact formation and metalization processes. Contact formation provides a pair of contact plugs 60 coupled to active regions 48 in optional second well 14 and a contact plug 62 coupled to active region 48 in first well 12. Contact plugs may be titanium or other refractive metal or composition. Metalization provides metal contacts (e.g. aluminum) to form a drain terminal 64, a source terminal 66, and a back gate terminal 68. Drain terminal 64 is coupled to one plug 60 and source terminal 66 is coupled to the other plug 60, while back gate terminal 68 is coupled to plug 62.

In the exemplary embodiment illustrating an n-channel device, substrate 10 is a p conductivity type, first well 12 is an n$^+$conductivity type well, and optional second well 14 is a p conductivity type well. Isolation region 18 separating first well 12 from optional second well 14 is a field oxide. LDD implant 28 is an n$^-$conductivity type implant, HE implant 44 is an n$^+$conductivity type implant, and source/drain implant 46 is an n$^+$conductivity type implant. For this embodiment, it is desirable for back gate 50 beneath the channel region under gate 16 to be electrically communicated to back gate terminal 68. One way the exemplary embodiment accomplishes this goal is to ensure that a depth of back gate 50 in first well 12 is not too great, allowing back gate 50 to lie within first well 12. Additionally, back gate 50 is continuous from an area beneath gate 16 to its connection into first well 12.

It is envisaged that there will be many uses for the structure shown in FIG. 5. One exemplary use regards improvement in short channel control, particularly in an n-channel MOS field effect transistor (FET). For example, FIG. 5 could represent such a MOSFET with a drain and a source defined by active regions 48 coupled to contact 64 and contact 66, respectively. A channel region 20 under gate 16 conducts current between the source and drain, under control of a voltage impressed upon gate 16. As the channel shortens (distance between active regions 48 in optional second well 14 decreases), it becomes increasingly difficult to turn off the MOSFET. By implementing the MOSFET as shown in FIG. 5, back gate terminal 68 helps to control the device. One preferred implementation is to ground terminal 68 when turning off the MOSFET. Grounding back gate 50 helps to turn off the transistor, thus improving control of the n-channel transistor.

In the description above, second well 14 is described as optional. For those embodiments not forming second well 14, those active region 48 and portions of back gate 50 disposed in optional well 14 are formed directly in substrate 10. As explained above, when forming back gate 50, it is desirable to have $X_p$ about equal $L_{eff}$ for short channel control. An additional consideration is to make $X_{sep}$ large enough to maintain a bias voltage that is required for circuit operations. The values of $X_p$ and $X_{sep}$ are adjustable, and depend upon a desired application.

The preferred embodiment describes use of an n-well for an n-channel MOSFET in order to provide a back gate connection. The description above sets forth a procedure to form an independent n-well for back gate connection. In some embodiments, it is not necessary for the back gate connection to be provided by a separate, dedicated n-well. In some devices, an appropriate n-well is readily available, such as when guard rings are formed around the active regions. The back gate connection could be made through the guard ring, in the appropriate circumstances. Thus, a dedicated n-well for the back gate is not necessarily required.

Figure 6:
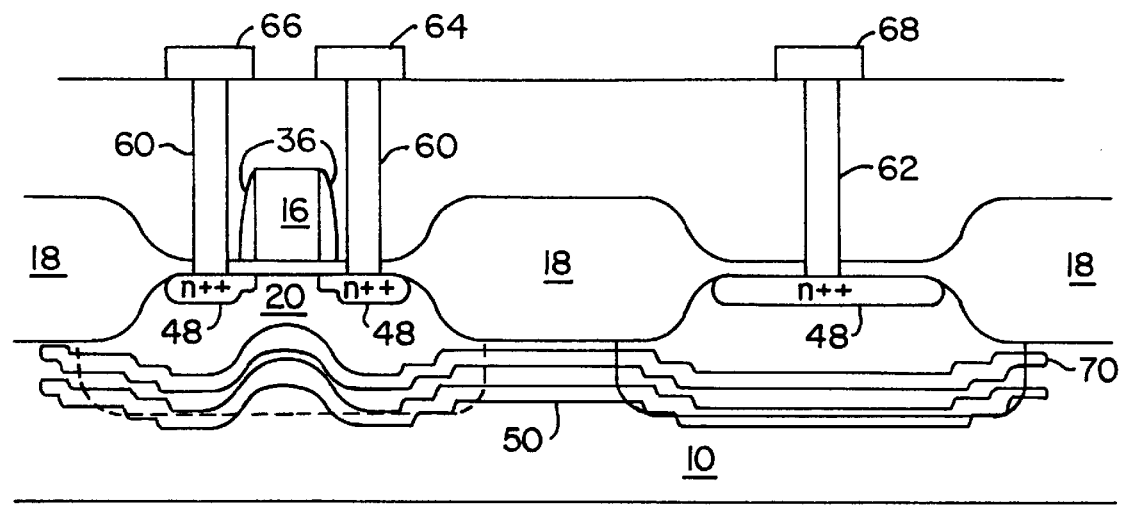
FIG. 6 is a partial, sectional view of a portion of the substrate illustrating an alternate embodiment having a second back gate added.

FIG. 6 is a partial, sectional view of a portion of substrate 10 shown in FIG. 5 illustrating an alternate embodiment having a second back gate 70. Prior to the annealing step result shown in FIG. 4, a second HE implant (not shown) is introduced to substrate 10 through second implant mask 40. This second HE implant is deep, lying between HE implant 44 and a surface of substrate 10. Annealing the second HE implant forms second back gate 70.

In the preferred embodiment, the second HE implant is also introduced through gate 16 and isolation region 18 to form a varying depth contour that matches HE implant 44. The annealing step, in this embodiment, forms second back gate 70 when back gate 50 is formed. The second HE implant is a p conductivity type (e.g., boron) implant having a dose range in a range of about $1 \times 10^{13}$ to about $1 \times 10^{15}$ atoms/cm$^3$, and a dose energy range of about 200 keV to about 700 keV. Note that second back gate 70 lies just above back gate 50 and has a matching depth contour. Second back gate 70 provides additional control flexibilities to short channel effects, enhances isolations between active regions 48 and back gate 50, and improves an effectiveness of isolation of isolation region 18.

Figure 7:
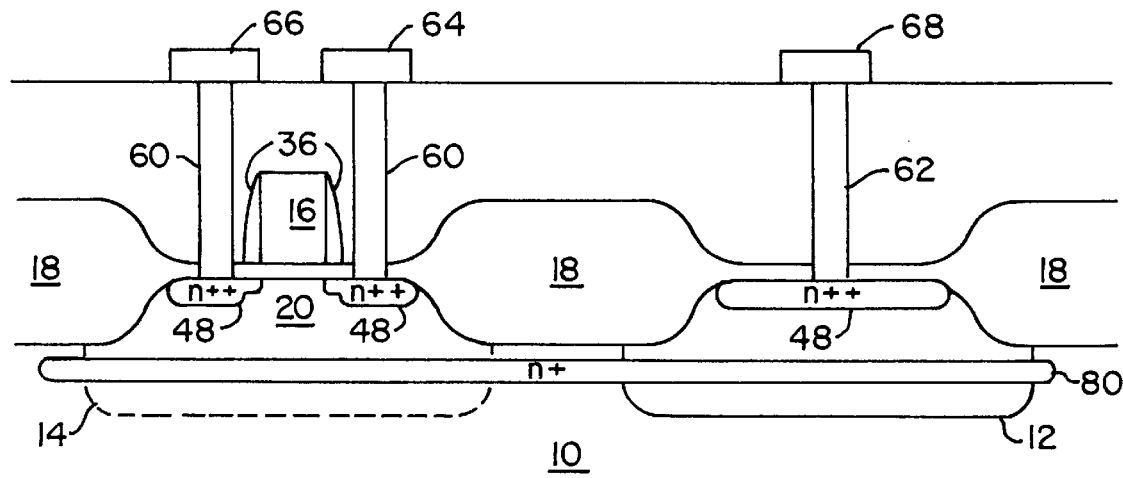
FIG. 7 is a partial, sectional view of a portion of a substrate illustrating an alternate preferred embodiment having a high energy back gate implanted prior to formation of field oxide regions and gate structures producing a planar back gate.

FIG. 7 is a partial, sectional view of a portion of substrate 10 illustrating an alternate preferred embodiment. In this alternate embodiment, introducing HE implant 44 (illustrated in FIG. 3 for example) prior to formation of gate 16 or isolation region 18 produces a planar HE implant (not shown). The source/drain annealing step produces planar back gate 80 from the planar HE implant. For different applications, one or more of the back gates illustrated in FIG. 6 may desirably be formed using this alternate embodiment to produce a planar back gate, rather than a varying depth contour back gate. In some embodiments, it may be desirable to form certain ones of the back gates as planar gates and other back gates as varying depth contoured gates. For example, in an application having two back gates, it may be desirable to have both back gates planar, one planar and the other varying depth contoured, or both varying depth contoured. The conductivity type of the back gates may be different, or the same. In the n-channel embodiment shown in FIG. 6 having a p conductivity type substrate and n type active regions, it may be preferable to have back gate 50 planar and second back gate 70 varying depth contoured. Other embodiments may have a planar second back gate 70 and a varying depth contoured back gate 50. The number of permutations increases as the number of back gates increases beyond two.

Figure 8:
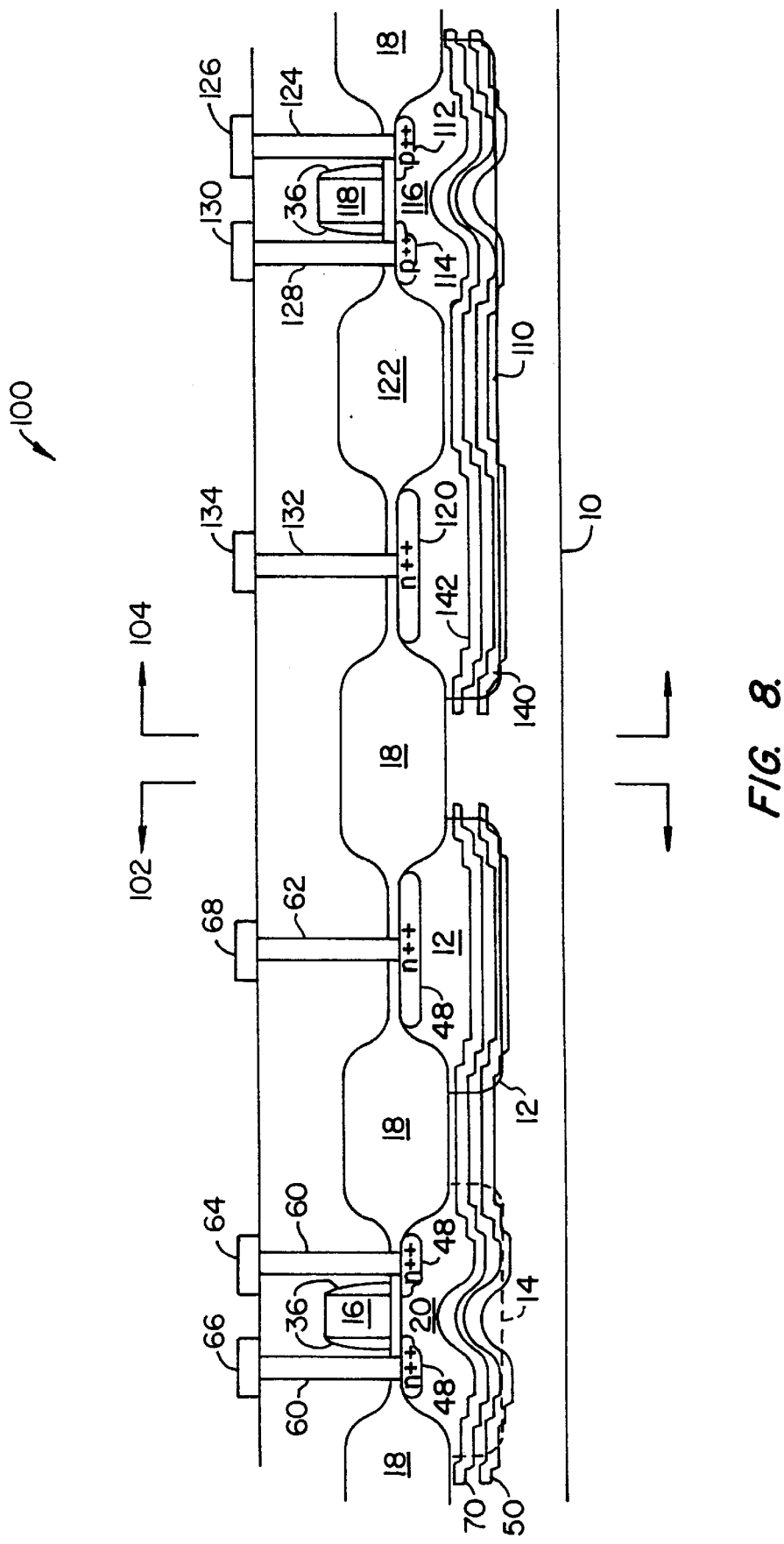
FIG. 8 is a partial, sectional view of a portion of a substrate illustrating an alternate preferred embodiment having a dual buried gate in a complementary metal oxide semiconductor (CMOS) device.

FIG. 8 is a partial, sectional view of a portion of substrate 10 illustrating an alternate preferred embodiment having a dual buried gate in a complementary metal oxide semiconductor (CMOS) device 100. As well known, CMOS device 100 includes an n-channel portion 102 and a p-channel portion 104. The structure of n-channel portion 102 is similar to the portion of the semiconductor device illustrated in FIG. 6 configured as an n-channel MOSFET.

P channel portion 104 includes an n-well 110 having a first p conductivity type active region 112 and a second p conductivity type active region 114 separated by a second channel region 116. A gate 118 overlies second channel region 116. N-well 110 also includes an n conductivity type active region 120 separated from active region 112 and active region 114 by an isolation region 122.

A plug 124 couples active region 112 to a source contact 126, a plug 128 couples active region 114 to a drain contact 130, and a plug 132 couples active region 120 to an n-well contact 134. Implanted deep into n-well 110 is a first p-channel back gate 140 and a second p-channel back gate 142.

In this alternate preferred embodiment, the two back gates in p-channel portion 104 are separated and isolated from the two back gates in n-channel portion 102. The back gates in n-channel portion 102 operate as described above to minimize the short channel effects while improving isolation of isolation region 18. In the alternate preferred embodiment, the shape and conductivity type of the back gates correspond to those in n-channel portion 102. That is, the back gates in p-channel portion 104 are varying depth contoured, with first p-channel back gate 140 deeper than second p-channel back gate 142. Additionally, first p-channel back gate 140 is n conductivity type and second p-channel back gate 142 is p conductivity type.

It is recognized in the art that performance of an n-channel transistor in a CMOS device is typically superior to that of the complementary p-channel transistor. The n-channel transistor's disadvantages relate to the short channel effects described above, such as leakage current. The dual back gates in n-channel portion 102 address these drawbacks and improve performance. However, p-channel transistors are typically poor transistors. In the alternate preferred embodiment, the dual back gates in p-channel portion 104 do not improve performance by addressing short channel effects. Rather, the combination of first p-channel back gate 140 and second p-channel back gate 142 collectively define a desirable retrograde profile for n-well 110.

The retrograde n-well profile is desirable in a p-channel device in that it offers advantages by improving latch-up immunity and other performance characteristics, such as improving guard ring efficiency to allow tighter layouts. As readily appreciated, separate masking requirements are required to implement the structure illustrated in FIG. 8. The alternate preferred embodiment illustrates a pair of back gates in n-channel portion 102 and in p-channel portion 104. Moreover, these back gates are illustrated as being varying depth contoured. In other embodiments, it may be desirable to implement a combination of planar back gates and contoured back gates. Note, the number and the type of back gates in each portion of CMOS 100 are independently controllable. That is, in some embodiments it may be desirable to have two back gates, the first planar and the second contoured, in the n-channel portion, but have a different configuration (number and/or type) of back gates in the p-channel portion.

In conclusion, the present invention provides a simple, efficient solution to a problem of short channel effect control, allowing improved scaleability of transistor design. While the above is a complete description of the preferred embodiments of the invention, various alternatives, modifications, and equivalents may be used. For example, the preferred embodiment describes introducing the back gate implant through the gate and isolation regions, creating a varying depth contour for the back gates. The profile is advantageous in that it is shallower under the gate and isolation regions, and deeper under the active regions, such as the source/drain regions to reduce junction capacitance and any chance for degradation of the source/drain junction. In other words, the back gate becomes self-aligned to the gate and to the LDD and S/D junctions.

Implanting through the gate (and therefore through the gate oxide under the gate) has the potential to damage the gate oxide. The potential damage is reduced because the projected range of the deep implants is far from the gate oxide. As well known, a proper anneal is able to anneal out some damage to the gate oxide. In some applications, gate oxide concern may require a different process. In some instances, a properly adapted large angle and tilt implant technique will achieve the desired back gate structure and reduce damage potential to the gate oxide by reducing dopants implanted through the gate oxide.

Therefore, the above description should not be taken as limiting the scope of the invention which is defined by the appended claims.

What is claimed is:

1. A method for forming a semiconductor device, comprising the steps of:

forming, coupled to a substrate having a first conductivity-type, a first active region and a second active region separated from each other by a channel region wherein a gate overlies said channel region, said active regions being a second conductivity-type;

forming, in said substrate, a well region of said second conductivity isolated from said active regions by an isolation region; thereafter implanting dopants of said second conductivity-type into said substrate through said active regions, said gate, said isolation region and said well region to form a first deep implant region that underlies said channel region and is electrically communicated to said well region;

implanting dopants of said second conductivity-type into said active regions and said well region; and thereafter annealing said substrate to produce a buried structure from said first implant region.

2. The semiconductor device forming method of claim 1, further comprising the step of:

implanting, prior to said annealing step, dopants of said first conductivity-type into said substrate through said active regions, said gate, said isolation region and said well region to form a second deep implant region that underlies said channel region and is disposed between said first implant region and said channel region, and wherein;

said annealing step produces a second buried structure from said second implant region.

3. A method for forming a semiconductor device, comprising the steps of:

forming, coupled to a substrate having a first conductivity-type, a first active region and a second active region separated from each other by a channel region wherein a gate overlies said channel region, said active regions being a second conductivity-type;

forming, in said substrate, a well region of said second conductivity isolated from said active regions by an isolation region; thereafter forming an implant mask over said substrate, said implant mask having exposure regions overlying said active regions, said gate, said isolation region and said well region;

implanting dopants of said second conductivity-type through said exposure regions of said implant mask to produce a first implant region that underlies said channel region and is electrically communicated to said well region implanting dopants of said second conductivity-type through said exposure regions of said implant mask into said active regions and said well region; and thereafter annealing said substrate to produce a buried structure from said first deep implant region.

4. The semiconductor device forming method of claim 3 wherein said first implant region implanting step comprises applying a implant having a dose in a dose range of about $1 \times 10^{13}$ to about $1 \times 10^{16}$.

5. The semiconductor device forming method of claim 4 wherein said first implant region implanting step comprises applying said implant having said dose less than about $1 \times 10^{15}$.

6. The semiconductor device forming method of claim 4 wherein said first implant region implanting step comprises implanting arsenic atoms having an energy range of about 750 keV to about 2250 keV.

7. The semiconductor device forming method of claim 4 wherein said first implant region implanting step comprises implanting phosphorous atoms having an energy range of about 350 keV to about 1200 keV.

8. The semiconductor device forming method of claim 4 further comprising the step of:

forming contacts coupled to said active regions, said gate, and to said well region.

9. The semiconductor device forming method of claim 4 further comprising the step of:

implanting, prior to said annealing step, dopants of said first conductivity-type through said exposure regions of said implant mask to produce a second implant region that underlies said channel region and is disposed between said first implant region and said channel region, and wherein;

said annealing step produces a second buried structure from said second implant region.

10. The semiconductor device forming method of claim 9 wherein said second implant region implanting step comprises applying a second implant having a second dose in a second dose range of about $1 \times 10^{13}$ to about $1 \times 10^{15}$.

11. The semiconductor device forming method of claim 10 wherein said second implant region implanting step comprises implanting boron ($B^{11}$) atoms having a second energy range of about 200 keV to about 700 keV.

12. A method for forming a semiconductor device, comprising the steps of:

implanting a buried layer implant in a substrate having a first conductivity-type, said buried layer having a second conductivity type; thereafter forming, coupled to said substrate, a first active region and a second active region overlying said implant separated from each other by a channel region wherein a gate overlies said channel region, said active regions being a second conductivity-type;

forming, in said substrate, a well region of said second conductivity isolated from said active regions by an isolation region, said well region electrically communicated to said buried layer; thereafter implanting dopants of said second conductivity-type into said active regions and said well region; and thereafter annealing said substrate to produce a buried structure from said buried implant.

13. The method of 12 wherein said buried structure is planar.

* * * * *